United States Patent
Kumagai et al.

(10) Patent No.: US 10,410,895 B2
(45) Date of Patent: Sep. 10, 2019

(54) CONVEYANCE CONTROL DEVICE AND CONVEYANCE CONTROL SYSTEM

(71) Applicant: Murata Machinery, Ltd., Kyoto-shi, Kyoto (JP)

(72) Inventors: Kenji Kumagai, Inuyama (JP); Atsushi Kobayashi, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 15/744,415

(22) PCT Filed: Jun. 2, 2016

(86) PCT No.: PCT/JP2016/066453
§ 371 (c)(1),
(2) Date: Jan. 12, 2018

(87) PCT Pub. No.: WO2017/010183
PCT Pub. Date: Jan. 19, 2017

(65) Prior Publication Data
US 2018/0208404 A1   Jul. 26, 2018

(30) Foreign Application Priority Data
Jul. 15, 2015   (JP) .................................. 2015-141065

(51) Int. Cl.
*H01L 21/677* (2006.01)
*B65G 43/10* (2006.01)
(Continued)

(52) U.S. Cl.
CPC ............ *H01L 21/677* (2013.01); *B65G 43/02* (2013.01); *B65G 43/10* (2013.01); *G05D 1/02* (2013.01);
(Continued)

(58) Field of Classification Search
CPC ............................. B65G 43/10; H01L 21/677
See application file for complete search history.

(56) References Cited

U.S. PATENT DOCUMENTS 4,856,904 A * 8/1989 Akagawa ............. H01L 21/681
356/400
2006/0271252 A1   11/2006 Hori et al.
(Continued)

FOREIGN PATENT DOCUMENTS

| JP | 2007-200040 A | 8/2007 |
| JP | 4438095 B2 | 1/2010 |
| JP | 5446055 B2 | 1/2014 |

OTHER PUBLICATIONS

English language translation of International Search Report dated Jul. 12, 2016 issued in corresponding PCT application PCT/JP2016/066453.

*Primary Examiner* — Thomas Randazzo
(74) *Attorney, Agent, or Firm* — DLA Piper LLP (US)

(57) ABSTRACT

A conveyance control device according to one aspect of the present invention is configured to control operation of one or more carriages each configured to convey a FOUP. The conveyance control device includes: a basic processing unit that generates basic command data based on basic input data 32a containing a request to convey the FOUP; an optimization processing unit that generates optimization command data based on optimization input data containing the request to convey the FOUP; an output unit that outputs the basic command data or the optimization command data to each of the carriages; and a switching unit that controls operation of at least one of the basic processing unit, the optimization processing unit, and the output unit such that either one of the basic command data and the optimization command data is output by the output unit.

6 Claims, 6 Drawing Sheets

(51) Int. Cl.
   *G05D 1/02*   (2006.01)
   *B65G 43/02*   (2006.01)
(52) U.S. Cl.
   CPC .. *H01L 21/6773* (2013.01); *B65G 2201/0297* (2013.01); *B65G 2203/0266* (2013.01)

(56) References Cited

U.S. PATENT DOCUMENTS

| | | | | |
|---|---|---|---|---|
| 2012/0004767 | A1* | 1/2012 | Tominaga | H01L 21/67736 700/230 |
| 2013/0197719 | A1* | 8/2013 | Nagasawa | G05D 1/0027 701/2 |
| 2016/0189991 | A1* | 6/2016 | Takagi | G05B 19/41865 414/805 |

* cited by examiner

| | BASIC ITEM | ADDITIONAL ITEM |
|---|---|---|
| CONVEYANCE PATH | CONVEYANCE PATH ID, LENGTH, SHAPE, CLOSURE CONDITION | CONVEYANCE-PATH USE PLAN |
| LOAD PORT | LOAD PORT ID, PRESENCE OR ABSENCE OF FOUP | LOAD-PORT USE PLAN |
| CARRIAGE | CARRIAGE ID, POSITION, TIME, TYPE, COMMAND EXECUTION STATUS | |
| CONVEYANCE REQUEST | CONVEYANCE REQUEST ID, From, To, FOUPID | PRIORITY |

32a — BASIC ITEM column
33a — ADDITIONAL ITEM column (b)

| | BASIC ITEM | ADDITIONAL ITEM |
|---|---|---|
| CARRIAGE COMMAND | CARRIAGE COMMAND ID, From, To, FOUPID, CONVEYANCE REQUEST ID | TRAVEL ROUTE, SET OF ARRIVAL POSITION AND TIME |

32b — BASIC ITEM column
33b — ADDITIONAL ITEM column

CONVEYANCE CONTROL DEVICE AND CONVEYANCE CONTROL SYSTEM

CROSS REFERENCE TO RELATED APPLICATIONS

This application is a national stage of international application no. PCT/JP2016/066453 filed on Jun. 2, 2016, and claims the benefit of priority under 35 USC 119 of Japanese application no. 2015-141065, filed on Jul. 15, 2015, both of which are incorporated herein by reference.

TECHNICAL FIELD

This disclosure relates to a conveyance control device and a conveyance control system.

BACKGROUND

A system configured to control traveling of carriages each configured to convey an article such as a semiconductor in, for example, a production line producing semiconductors or the like is known in the art. Japanese Patent No. 5446055 describes a carriage system configured to control a distance between carriages by periodically reporting carriage statuses from a plurality of carriages to a ground controller and periodically transmitting traveling instructions from the ground controller to the carriages. Japanese Patent No. 4438095 describes that a controller estimates current positions of respective carriages on the basis of positions of which the controller is notified by the carriages, information indicating whether to turn into a branch or travel straight, and time, and searches a travel route for avoiding congestion on the basis of distribution of the current positions of the respective carriages estimated. By performing optimization processing of estimating future statuses on the basis of current statuses of carriages, for example, and determining travel speeds of the carriages, travel routes therefor, and the like on the basis of the estimated results as described above, conveyance efficiency can be expected to be improved.

Because the optimization processing described above is relatively complicated processing, software (program) for executing the processing needs verification of how the software actually operates and continual updates to improve the functions. When such an update of the software has been performed, it may be found that the updated software has a problem (bug, etc.). In that case, rollback processing for recovering the software to the state before being updated is usually performed by an operator, for example. By performing the rollback processing, normal processing using the software before being updated is restarted. However, until the rollback processing is completed, the optimization processing for determining operations of conveyance machines stops. Thus, the problem that operations of the conveyance machines stop and work of conveying articles stops may occur.

In view of this, it could be helpful to provide a conveyance control device and a conveyance control system that can prevent operations of conveyance machines from stopping.

SUMMARY

We thus provide:

A conveyance control device according to one aspect is a conveyance control device configured to control operation of one or more conveyance machines each configured to convey an article. The conveyance control device includes: first processing means for generating first command data indicating operation that each of the conveyance machines is commanded to perform, based on first input data containing a request to convey the article; second processing means for generating second command data indicating operation that each of the conveyance machines is commanded to perform, based on second input data containing the request to convey the article; output means for outputting the first command data generated by the first processing means or the second command data generated by the second processing means to each of the conveyance machines; and switching means for controlling operation of at least one of the first processing means, the second processing means, and the output means such that either one of the first command data and the second command data is output by the output means.

In the conveyance control device according to the aspect, pieces of command data to be output to the conveyance machines can be generated by the first processing means and the second processing means. Which of the command data generated by the first processing means and the command data generated by the second processing means is to be output can be switched by the switching means. Thus, with the conveyance control device, even if abnoir ial processing has occurred in one of the first processing means and the second processing means due to a software bug, for example, switching can be performed such that command data generated by the other of the first processing means and the second processing means is output. This enables the output means to continue outputting command data to each of the conveyance machines. This consequently enables each of the conveyance machines to continue to perform operation based on command data, and thus operations of the conveyance machines can be prevented from stopping.

In the conveyance control device, the second input data may contain a basic item contained in the first input data and an additional item that is not contained in the first input data, and the second command data may contain a basic item contained in the first command data and an additional item that is not contained in the first command data. The switching means may cause the second processing means to operate with higher priority, and may perform switching such that the first processing means operates when having detected a trigger indicating a request to cause the first processing means to operate.

In the conveyance control device, the second processing means for generating the second command data containing information items more than those of the first command data on the basis of the second input data containing information items more than those of the first input data is caused to operate with higher priority. This enables, under normal conditions, the second command data that is more detailed than the first command data to be output to each of the conveyance machines, and thus conveyance operation of the conveyance machine can be sophisticated (made efficient, or optimized, for example). When having detected a trigger indicating a request to cause the first processing means to operate, the switching means performs switching such that the first processing means operates. Thus, for example, when processing by the second processing means cannot be performed because, for example, a process content of the second processing means needs to be changed, operation of each of the conveyance machines can be continued by outputting the first command data generated by the first processing means to the conveyance machine.

The conveyance control device may further include an abnormal processing detection means for monitoring processing performed by the second processing means to detect occurrence of abnormal processing. The switching means may detect as the trigger the occurrence of abnormal processing detected by the abnormal processing detection means and perform switching such that the first processing means operates.

In the conveyance control device, when occurrence of abnormal processing has been detected in the processing performed by the second processing means, the switching means automatically performs switching such that the first processing means operates. This can prevent the abnormal processing from being continued, and operation of each of the conveyance machines can be continued by using the first command data generated by the first processing means.

The conveyance control device may further include restoration means for restoring a process content of the second processing means when the abnormal processing detection means has detected the occurrence of abnormal processing. The switching means may detect that the restoring by the restoration means has been completed, and perform switching such that the second processing means operates.

In the conveyance control device, when occurrence of abnormal processing has been detected, the switching means automatically performs switching such that the first processing means operates, and the restoration means restores the process content of the second processing means. After the restoring has been completed, the switching means performs switching such that the second processing means operates again. As described above, with the conveyance control device, until the restoring the process content of the second processing means is completed, operation of each of the conveyance machines can be continued by causing the first processing means to operate. After the restoring the process content of the second processing means has been completed, operation of each of the conveyance machines can be sophisticated (made efficient, or optimized, for example) by causing the second processing means to operate again.

A conveyance control system according to one aspect is a conveyance control system including one or more conveyance machines each configured to convey an article and a conveyance control device configured to control operation of each of the conveyance machines. The conveyance control device includes: first processing means for generating first command data indicating operation that each of the conveyance machines is commanded to perform, based on first input data containing a request to convey the article; second processing means for generating second command data indicating operation that each of the conveyance machines is commanded to perform, based on second input data containing the request to convey the article; output means for outputting the first command data generated by the first processing means or the second command data generated by the second processing means to each of the conveyance machines; and switching means for controlling operation of at least one of the first processing means, the second processing means, and the output means such that either one of the first command data and the second command data is output by the output means. Each conveyance machine includes: first operation control means for receiving the first command data and controlling operation of the machine based on the first command data; and second operation control means for receiving the second command data and controlling the machine based on the second command data.

In the conveyance control system described above, in the conveyance control device, pieces of command data to be output to the conveyance machines can be generated by the first processing means and the second processing means. Each conveyance machine includes pieces of operation control means each corresponding to the first command data and the second command data that the conveyance machine can receive. In other words, the conveyance control device and each of the conveyance machines include a line (a pair of the first processing means and the first operation control means) configured to perform operation control of the conveyance machine based on the first command data and a line (a pair of the second processing means and the second operation control means) configured to perform operation control of the conveyance machine based on the second command data. Thus, with the conveyance control system, for example, even if abnormal processing has occurred in one line, operation control of each of the conveyance machines can be continued when switching is performed by the switching means such that the other line operates. This can prevent operations of the conveyance machines from stopping.

A conveyance control device and a conveyance control system that can prevent operations of conveyance machines from stopping can be provided.

REFERENCE SIGNS LIST

1 . . . conveyance control system, 2 . . . carriage (conveyance machine), 3 . . controller (conveyance control device), 21 . . . notification unit, 22 . . . receiving unit, 23 . . . basic operation control unit (first operation control means), 24 . . . optimization operation control unit (second operation control means), 31 . . . reception unit, 32 . . . basic-processing-data storage unit, 32a . . . basic input data (first input data), 32b . . . basic command data (first command data), 33 . . . optimization-processing-data storage unit, 33a . . . optimization input data (second input data), 33b . . . optimization command data (second command data), 34 . . . basic processing unit (first processing means), 35 . . . optimization processing unit (second processing means), 36 . . . output unit (output means), 37 . . . abnormal processing detection unit (abnormal processing detection means), 38 . . . switching unit (switching means), 39 . . . restoration unit (restoration means)

DETAILED DESCRIPTION

An example will now be described in detail with reference to the attached drawings. In the description of the drawings, like or equivalent elements are designated by like reference signs, and duplicate explanation is omitted.

Figure 1:
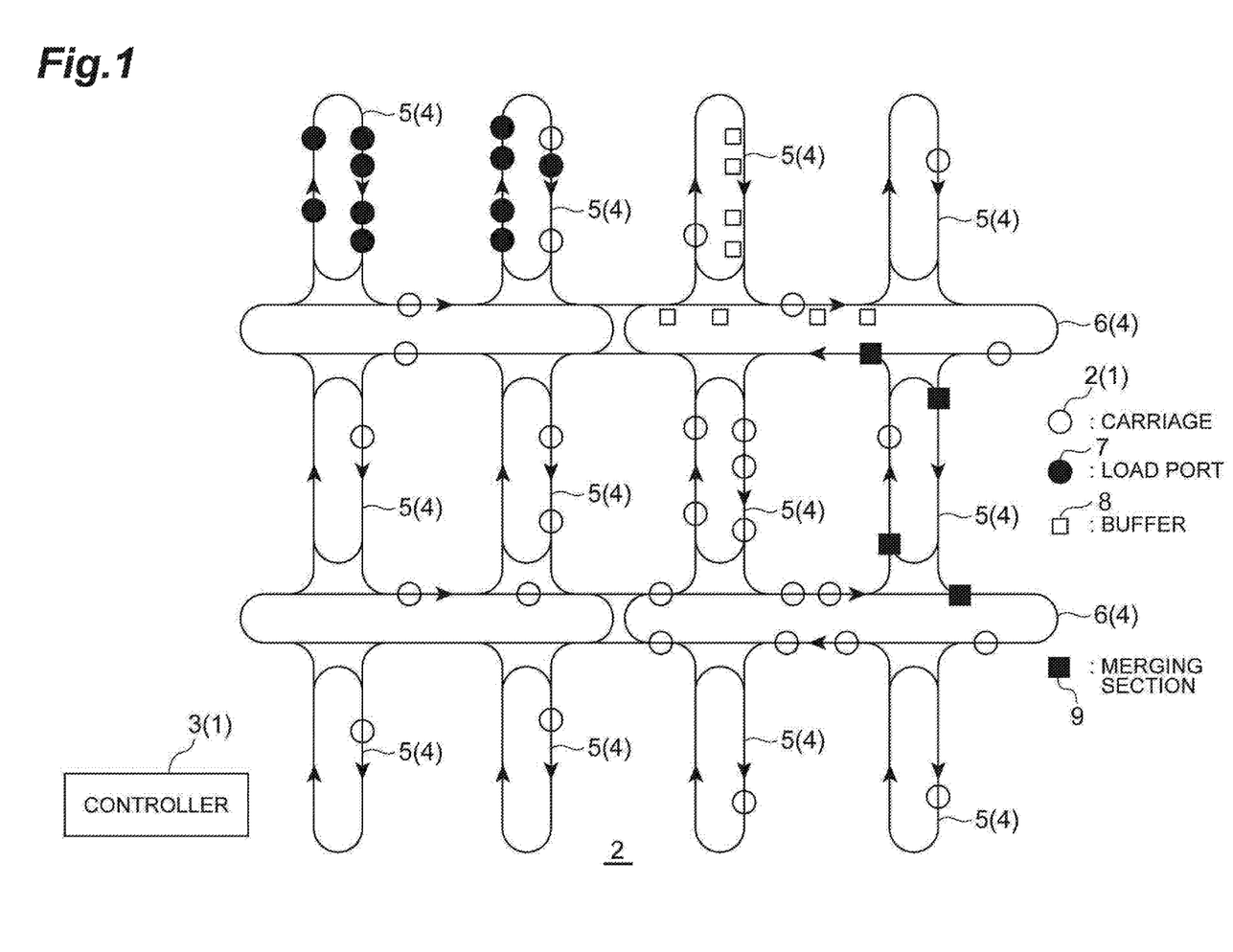
FIG. 1 is a diagram illustrating a layout example of a conveyance control system according to one embodiment of the present invention.
Figure 2:
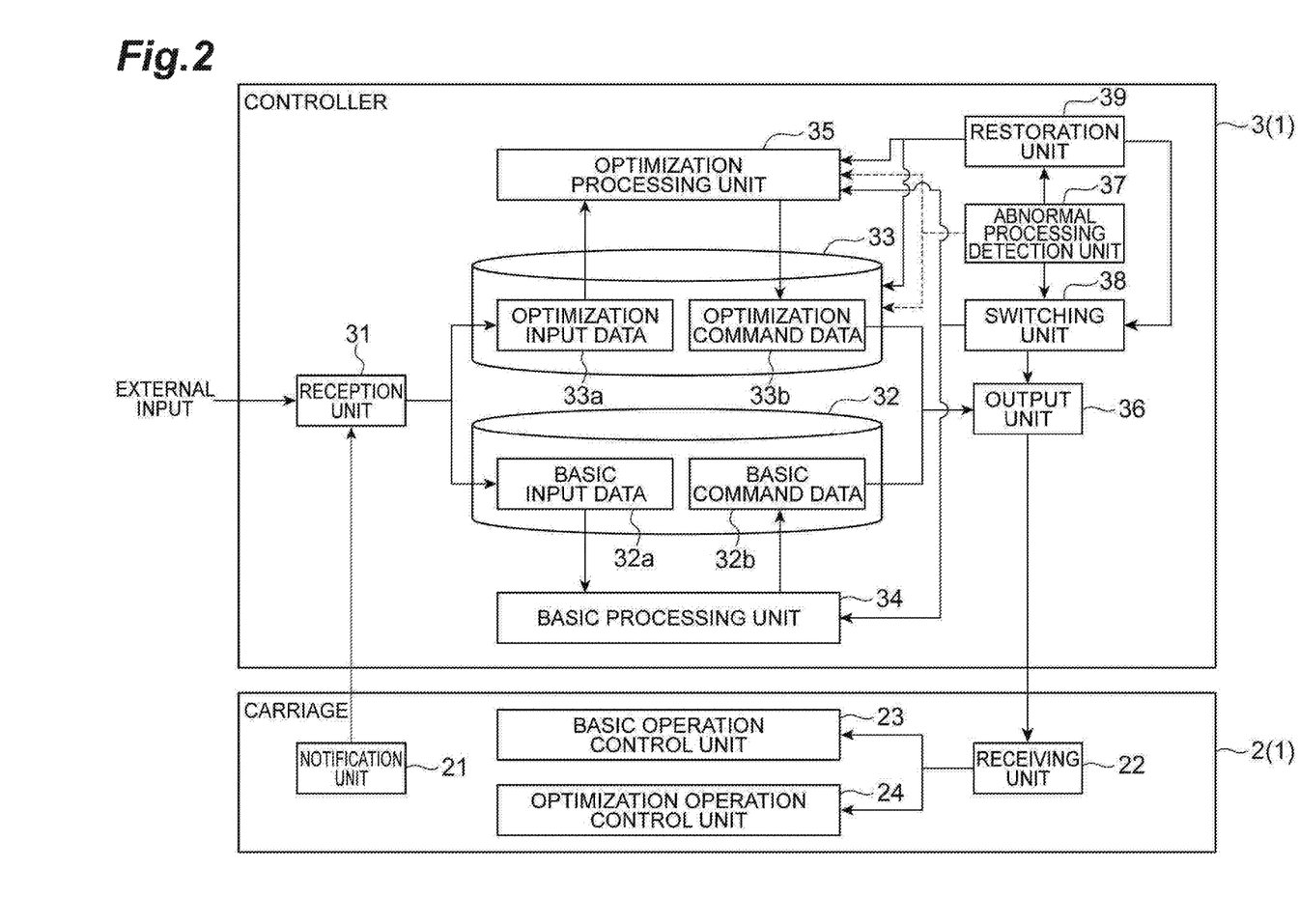
FIG. 2 is a block diagram illustrating a functional configuration of the conveyance control system.

FIG. 1 is a diagram illustrating a layout example of a conveyance control system according to one example. FIG. 2 is a block diagram illustrating a functional configuration of the conveyance control system. As depicted in FIGS. 1 and 2, this conveyance control system 1 according to the example includes one or more carriages (conveyance machines) 2 each configured to convey an article and a controller (conveyance control device) 3 configured to control operation of each carriage 2. The conveyance control system 1 includes a control line configured to perform operation control of each carriage 2 based on a low-level operation command (basic command data) and a control line configured to perform operation control of the carriage 2 based on a high-level operation command (optimization command data), and is configured to be able to switch these control lines. With this configuration, under normal conditions, operation control of the carriage 2 based on the high-level operation command is performed, whereby total optimization of conveyance control can be achieved. For example, when there is a problem in a process content (i.e., software that specifies the process content) for generating the high-level operation command, the operation control of the carriage 2 can be continued by switching to the operation control of the carriage 2 based on the low-level operation command.

As depicted in FIG. 1, each carriage 2 is provided to be able to travel along conveyance paths 4 such as rails laid in a factory. Examples of the carriage 2, the type of which is not limited to a particular type, include an overhead traveling vehicle, an automated guided vehicle, and a rail-guided carriage. In this example, the article conveyed by the carriage 2 is a cassette in which a plurality of semiconductor wafers are accommodated (what is called a front opening unified pod (FOUP)).

The conveyance paths 4 are divided into a plurality of (12 in the example of FIG. 1) sections (bays) to form a route (intra-bay route) 5 in each bay and a route (inter-bay route) 6 connecting different bays. Along these routes 5 and 6, load ports 7 and buffers 8 are provided. Each load port 7 is a location where a FOUP is transferred between a processing device (not depicted) and a carriage 2. Each buffer 8 is a location where a carriage 2 can temporarily put a FOUP. Merging sections 9 are locations at each of which exclusive control of eliminating a situation in which a plurality of carriages 2 simultaneously approach thereto is required, on the routes 5 and 6.

The controller 3 controls conveyance operation of each carriage 2 by outputting a conveyance command to the carriage 2 via wireless communication. The conveyance operation is a series of operations performed to convey a FOUP, and includes operation of loading a FOUP (loading operation) and operation of unloading a FOUP (unloading operation) in a load port 7 and a buffer 8, for example, and also traveling operation of traveling on a conveyance path 4. The controller 3 receives a conveyance request indicating a request for conveyance of a FOUP (e.g., information indicating that which FOUP needs to be conveyed from where to where) from, for example, a host controller such as a manufacturing execution system (MES) (not depicted), and assigns the conveyance request to a carriage 2. In other words, for each of conveyance requests received from the host controller, the controller 3 determines a carriage 2 to which the corresponding conveyance request is to be assigned, and commands the determined carriage 2 to perform operation specified in the conveyance request. Accordingly, operations specified in the respective conveyance requests are performed by carriages 2 to which the corresponding conveyance requests are assigned. In this example, a configuration will be described as one example in which the controller 3 directly controls carriages 2 that are present in the whole area to be controlled depicted in FIG. 1. However, the configuration of control by the controller 3 is not limited to this example. For example, the area to be controlled may be divided into a plurality of zones, and a zone controller configured to control carriages 2 in a zone may be provided in each zone. In this example, the controller 3 is configured to control carriages 2 via the zone controllers.

As depicted in FIG. 2, each carriage 2 includes, as functional components, a notification unit 21, a receiving unit 22, a basic operation control unit 23, and an optimization operation control unit 24. The controller 3 includes, as functional components, a reception unit 31, a basic-processing-data storage unit 32, an optimization-processing-data storage unit 33, a basic processing unit 34, an optimization processing unit 35, an output unit 36, an abnormal processing detection unit 37, a switching unit 38, and a restoration unit 39.

Figure 3:
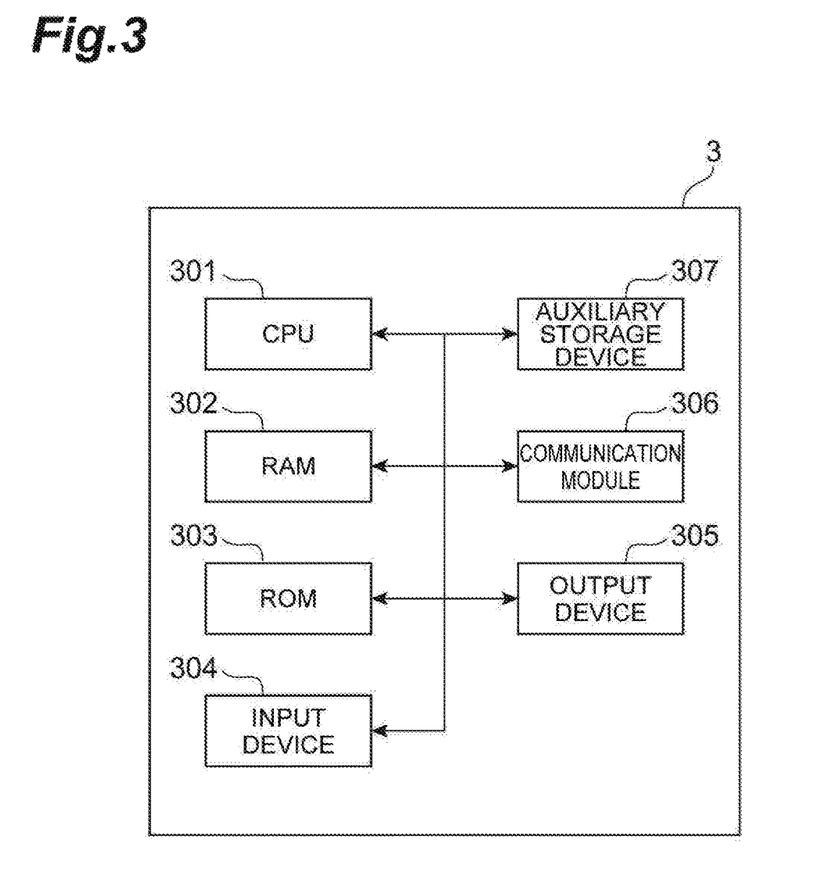
FIG. 3 is a block diagram illustrating one example of a hardware configuration of the conveyance control device.

As depicted in FIG. 3, as a hardware configuration, the controller 3 is configured as a computer system including at least one central processing unit (CPU) 301, at least one random access memory (RAM) 302 and at least one read only memory (ROM) 303 that are main memories, an input device 304 such as a keyboard for an operator to input operations, an output device 305 such as a display configured to display information to the operator, a communication module 306 for performing wire communication or wireless communication with outside, and an auxiliary storage device 307 such as a hard disk drive and a semiconductor memory. The controller 3 may be configured as one server device, or may be configured as a plurality of server devices that operate in a coordinated manner. Each function of the controller 3 depicted in FIG. 2 is implemented by reading a predetermined program on hardware such as the CPU 301 and the RAM 302 depicted in FIG. 3, for example, thereby causing the input device 304 and the output device 305 to operate and also causing the communication module 306 to operate under the control of the CPU 301, and reading and writing data in the RAM 302 and the auxiliary storage device 307.

The hardware configuration of each carriage 2 is, for example, a configuration having the hardware configuration of the controller 3 from which the input device and the output device are omitted. Each function of the carriage 2 depicted in FIG. 2 is implemented, in the same manner as the controller 3 described above, by reading a predetermined program on hardware such as the CPU and the RAM, thereby causing the communication module to operate under the control of the CPU, and reading and writing data in the RAM and the auxiliary storage device.

Figure 4:
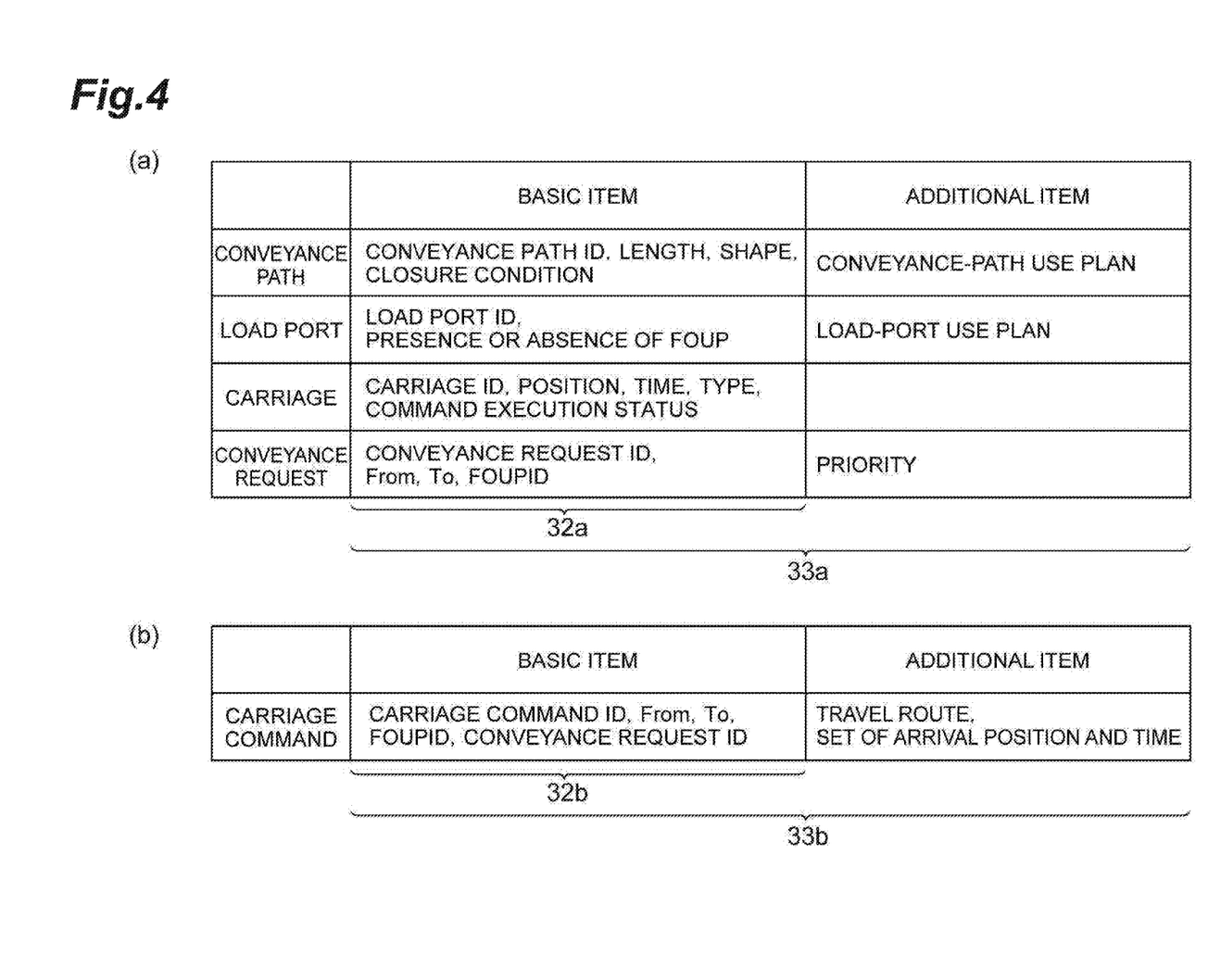
FIG. 4 (a and b) are diagrams illustrating examples of data used in the conveyance control system.

The following describes data used by each carriage 2 and the controller 3 with reference to FIG. 4(a). FIG. 4(a) illustrates examples of data input to the controller 3. Among pieces of data given in FIG. 4(a), pieces of data on the conveyance path, the load port, the conveyance request are, for example, pieces of data that are input to the controller 3 by external input from the host controller described above or the like. Pieces of data on the carriage are, for example, pieces of data that indicate the status of the carriage 2 of which the controller 3 is regularly notified by the notification unit 21 of the carriage 2.

The basic items given in FIG. 4(a) are items that are contained in basic input data (first input data) 32a containing a conveyance request of a FOUP. The basic input data 32a is data stored in the basic-processing-data storage unit 32. The basic input data 32a is data that is used to generate basic command data (first command data) 32b by the basic processing unit 34. The basic command data 32b is command data for causing the carriage 2 to perform low-level conveyance operation that is relatively simple.

The additional items given in FIG. 4(a) are items that are not contained in the basic input data and are contained only in optimization input data (second input data) 33a. In other words, the optimization input data 33a is data containing both of the basic items and the additional items. The optimization input data 33a is data stored in the optimization-processing-data storage unit 33. The optimization input data 33a is data that is used to generate optimization command data (second command data) 33b by the optimization processing unit 35. The optimization command data 33b is command data for causing the carriage 2 to perform high-level conveyance operation that is relatively complicated. When the optimization processing unit 35 described later performs processing by using only the basic input data, the column of the additional items may be blank. In other words, the basic input data 32a and the optimization input data 33a may be the same.

In the example of FIG. 4(a), the basic items on the conveyance path (routes 5 and 6) are a conveyance path ID for identifying a conveyance path, the length of the conveyance path, a shape such as a curve or a straight line, and a closure condition indicating, for example, the presence or absence of a loop in the conveyance path. The additional item on the conveyance path is a conveyance-path use plan (e.g., plan information including a maintenance time zone and an available time zone of the conveyance path). The basic items on the load port (load port 7) are a load port ID for identifying a load port and the presence or absence of a FOUP. The additional item on the load port is a load-port use plan (e.g., plan information including a maintenance time zone and an available time zone of the load port).

The basic items on the carriage (carriage 2) are a carriage ID for identifying a carriage, the position of the carriage on the conveyance path 4, time when the carriage was present in this position, the type of the carriage (e.g., information indicating a carriage type such as an overhead traveling vehicle), and a command execution status indicating, for example, the presence or absence of a conveyance request assigned to the carriage. In the example of FIG. 4(a), there is no additional item on the carriage. The basic items on the conveyance request are a conveyance request ID for identifying the conveyance request, "From" indicating a loading location, "To" indicating an unloading location, and a FOUPID for identifying a FOUP to be conveyed. The additional item on the conveyance request is a priority among a plurality of conveyance requests.

FIG. 4(b) illustrates examples of command data output from the controller 3 to the carriage 2. The basic items given in FIG. 4(b) are items that are contained in the basic command data 32b. The additional items given in FIG. 4(b) are items that are contained only in the optimization command data 33b. In other words, the optimization command data 33b is data containing both of the basic items and the additional items. In the example of FIG. 4(b), the basic items are a carriage command ID for identifying a carriage command, "From" indicating a loading location, "To" indicating an unloading location, a FOUPID for identifying a FOUP to be conveyed, and a conveyance request ID indicating an assigned conveyance request. The additional items are a travel route that the carriage 2 is instructed to follow (e.g., order of passing through several specific locations that are preset on a conveyance path 4), and one or more pieces of set information on arrival position and time (e.g., information associating each specific location described above with time when to arrive at the specific location).

Referring back to FIG. 2, the respective functional components of the carriages 2 and the controller 3 that constitute the conveyance control system 1 will be described.

The respective functions of each carriage 2 will be described first. The notification unit 21 is means for regularly (e.g., in a period of 1 millisecond to 1 second) notifying the controller 3 of the status of the carriage 2. Specifically, the notification unit 21 notifies the controller 3 of the pieces of data (hereinafter called "carriage report data") indicating the status of a carriage including the carriage ID, the position, time, the type, and the command execution status as illustrated in FIG. 4(a).

The receiving unit 22 is a means for receiving command data from the controller 3. The receiving unit 22 identifies the type of the command data from the controller 3 on the basis of information contained in a header of the command data. If having identified the received command data as a basic command data 32b, the receiving unit 22 sends this basic command data 32b to the basic operation control unit 23. If having identified the received command data as an optimization command data 33b, the receiving unit 22 sends this optimization command data 33b to the optimization operation control unit 24. As described above, as one example, in the carriage 2, the receiving unit 22 identifies the type of the command data, and assigns the command data (the basic command data 32b or the optimization command data 33b) to the operation control unit (the basic operation control unit 23 or the optimization operation control unit 24) that is appropriate depending on the type of the command data. This enables two different lines of commands to be switched to be performed.

The basic operation control unit 23 is a means (first operation control means) for receiving the basic command data 32b and controlling operation of the carriage on the basis of this basic command data 32b. The optimization operation control unit 24 is a means (second operation control means) for receiving the optimization command data 33b and controlling the operation of the carriage on the basis of this optimization command data 33b. The optimization operation control unit 24 can perform control based on a travel route and one or more pieces of set information on arrival position and time in addition to the basic command data 32b, and thus can perform more sophisticated control than that performed by the basic operation control unit 23.

Herein, the travel route and the set information contained in the optimization command data 33b are pieces of information that are generated by the optimization processing unit 35, for example, from a viewpoint of total optimization in work of conveying FOUPs. Specifically, the travel route is a travel route (optimized travel route) that is set for the carriage 2 so that a plurality of conveyance requests can be completed in the shortest period of time. The one or more pieces of set information on arrival position and time are pieces of information that are determined to prevent interference between a plurality of carriages 2 (e.g., distance between the carriages becomes too short, or one carriage 2 impedes traveling of another carriage 2). Thus, the optimization operation control unit 24 can cause the carriage to move along an optimized travel route based on the travel route contained in the optimization command data. The optimization operation control unit 24 can control traveling of the carriage to prevent interference with another carriage 2 by, for example, controlling acceleration and deceleration of the carriage to adjust the time to arrive at each specific location on the basis of the set information contained in the optimization command data.

The following describes the respective functions of the controller 3. The reception unit 31 is means for receiving pieces of data (pieces of data given in FIG. 4(a)) that are used to generate the basic input data 32a and the optimization input data 33a from the host controller and the carriage 2, for example. The reception unit 31 stores, as the basic input data 32a, pieces of data on the basic items among pieces of the received data in the basic-processing-data storage unit 32, and stores pieces of data on the basic items and the additional items among the pieces of the received data in the optimization-processing-data storage unit 33.

The basic-processing-data storage unit 32 is storage means configured so that data therein can be accessed (e.g., read and written) from the basic processing unit 34, and stores therein the basic input data 32a used for processing of the basic processing unit 34 and the basic command data 32b generated by the basic processing unit 34. The optimization-processing-data storage unit 33 is storage means configured so that data therein can be accessed (e.g., read and written) from the optimization processing unit 35, and stores therein the optimization input data 33a used for processing of the optimization processing unit 35 and the optimization command data 33b generated by the optimization processing unit 35.

In this example, as described above, a configuration is exemplified in which the basic-processing-data storage unit 32 and the optimization-processing-data storage unit 33 are provided separately. However, the basic-processing-data storage unit 32 and the optimization-processing-data storage unit 33 may be configured as a common storage unit. In this example, the basic processing unit 34 that requires the basic input data 32a can perform processing by using only pieces of data on the basic items among pieces of data stored in the common storage unit. The optimization processing unit 35 that requires the optimization input data 33a can perform processing by using pieces of data on both of the basic items and the additional items among the pieces of data stored in the storage unit.

The basic processing unit 34 is means (first processing means) for generating the basic command data 32b indicating operation that the carriage 2 is commanded to perform based on the basic input data 32a. The optimization processing unit 35 is means (second processing means) for generating the optimization command data 33b indicating operation that the carriage 2 is commanded to perform based on the optimization input data 33a. The basic processing unit 34 and the optimization processing unit 35 are switched by the switching unit 38 such that only either one thereof operates. However, the basic processing unit 34 and the optimization processing unit 35 may be caused to simultaneously operate. In this example, the switching unit 38 may switch operation of the output unit 36 such that the output unit 36 outputs command data generated by either one of the basic processing unit 34 and the optimization processing unit 35. As one example, the switching unit 38 is configured to control operations of the basic processing unit 34 and the optimization processing unit 35 so as to cause either one of the basic processing unit 34 and the optimization processing unit 35 to operate. More specifically, in this example, switching can be performed by the switching unit 38 such that the optimization processing unit 35 operates with higher priority. In other words, when there is not a problem such as a software bug in a process content of the optimization processing unit 35, the optimization processing unit 35 operates with higher priority than the basic processing unit 34. The following describes the basic processing unit 34 and the optimization processing unit 35, focusing on an example in which, based on conveyance requests input from the host controller and pieces of carriage report data received from the respective carriages 2, the controller 3 performs assignment control of assigning the conveyance requests to the respective carriages 2.

The basic processing unit 34 performs lower-level processing than that performed by the optimization processing unit 35. In the example of the assignment control described above, the basic processing unit 34 generates basic command data 32b which contents are relatively simple and do not depend on, for example, arrangement layouts of conveyance paths 4, load ports 7, buffers 8, and the like. Specifically, the basic processing unit 34 processes the respective conveyance requests received from the host controller, in the order in which the conveyance requests are received. The basic processing unit 34 assigns a conveyance request to a carriage 2 that is present in a position closest to a location (i.e., location indicated by "From" in the conveyance request) in which a FOUP (i.e., FOUP indicated by a FOUPID contained in the conveyance request) to be conveyed indicated by the conveyance request is present.

More specifically, the basic processing unit 34 refers to the pieces of carriage report data (i.e., items on the carriage in the basic input data 32a) received from the respective carriages 2, thereby identifying the carriage 2 that is present in a position closest to the FOUP to be conveyed indicated in the conveyance request. The basic processing unit 34 generates basic command data 32b containing information (i.e., basic items given in FIG. 4(a)) that instructs the identified carriage 2 to operate in accordance with the conveyance request. The basic command data 32b generated by the basic processing unit 34 is stored in the basic-processing-data storage unit 32, for example. The output unit 36 extracts and outputs this basic command data 32b to the carriage 2 to be commanded. Although the processing performed by the basic processing unit 34 is merely an example, the basic processing unit 34 performs such relatively simple low-level processing.

The optimization processing unit 35 uses pieces of information more than those used by the basic processing unit 34 to perform higher-level processing than that performed by the basic processing unit 34. For example, based on information on "priority" that is an additional item on the conveyance request, the optimization processing unit 35 processes, with higher priority, a conveyance request which priority is higher among a plurality of conveyance requests received from the host controller. The optimization processing unit 35 also performs optimization processing of assigning each of a plurality of conveyance requests to the corresponding carriage 2 such that operations specified in the conveyance requests are completed in the shortest period of time. In other words, instead of processing the conveyance requests in the order in which the conveyance requests are received as in the basic processing unit 34, the optimization processing unit 35 performs optimized assignment such that a conveyance request which priority is higher is processed with higher priority and operations of a plurality of conveyance requests are most efficiently completed in the shortest period of time.

As one example, to accomplish the assignment described above, the optimization processing unit 35 determines which conveyance request needs to be assigned to each carriage 2, and generates a travel route and one or more pieces of set information on arrival position and time for each carriage 2.

The optimization processing unit 35 then generates optimization command data 33b containing information (i.e., the basic items given in FIG. 4(a)) that instructs each carriage 2 to perform the corresponding conveyance request and also containing information (i.e., the additional items given in FIG. 4(b)) that instructs each carriage 2 to perform specific traveling control. The optimization command data 33b generated by the optimization processing unit 35 is stored in the optimization-processing-data storage unit 33, for example. The output unit 36 extracts and outputs this optimization command data 33b to the carriage 2 to be commanded. Although the processing performed by the optimization processing unit 35 is merely an example, the optimization processing unit 35 performs such relatively complicated high-level optimization processing.

As described above, the output unit 36 is means (output means) for outputting, to the carriage 2 to be commanded, the basic command data 32b generated by the basic processing unit 34 and stored in the basic-processing-data storage unit 32 or the optimization command data 33b generated by the optimization processing unit 35 and stored in the optimization-processing-data storage unit 33. At each control periods of the controller 3, command data (the basic command data 32b or the optimization command data 33b) may be stored in only either one of the basic-processing-data storage unit 32 and the optimization-processing-data storage unit 33, and the output unit 36 may output this command data. Alternatively, at each control periods of the controller 3, the command data may be stored in both of the basic-processing-data storage unit 32 and the optimization-processing-data storage unit 33, and the output unit 36 may select and output the command data stored in either one of the basic-processing-data storage unit 32 and the optimization-processing-data storage unit 33. In the latter example, which of the basic command data 32b and the optimization command data 33b is to be selected by the output unit 36 may be switched by the switching unit 38. Herein, any method may be used to cause the output unit 36 to grasp which command data (the basic command data 32b or the optimization command data 33b) needs to be output to which carriage 2. For example, the basic processing unit 34 or the optimization processing unit 35 may use the carriage ID to be commanded as an item contained in the command data, thereby causing the output unit 36 to grasp the carriage 2 to be commanded. The basic processing unit 34 or the optimization processing unit 35 may notify the output unit 36 of information indicating a link between each carriage command ID and the corresponding carriage ID on an individual basis.

The abnormal processing detection unit 37 is means (abnormal processing detection means) for monitoring processing performed by the optimization processing unit 35 to detect occurrence of abnormal processing. For example, when any exceptional processing (e.g., processing that falls under a predetermined exceptional pattern) has occurred in arithmetic processing performed by the optimization processing unit 35, the abnormal processing detection unit 37 detects occurrence of abnormal processing. The abnormal processing detection unit 37 may monitor data (e.g., the optimization input data 33a) stored in the optimization-processing-data storage unit 33 accessed by the optimization processing unit 35 to detect occurrence of abnormal processing. For example, the abnormal processing detection unit 37 may detect, as occurrence of abnormal processing, that data stored in the optimization-processing-data storage unit 33 has been replaced with an invalid value (e.g., a negative value has been substituted for data that is defined to be a natural number) during data processing performed by the optimization processing unit 35. When having detected occurrence of abnormal processing, the abnormal processing detection unit 37 notifies the switching unit 38 and the restoration unit 39 of detection information indicating that the occurrence of abnormal processing has been detected.

The switching unit 38 is means (switching means) for controlling operation of at least one of the basic processing unit 34, the optimization processing unit 35, and the output unit 36 such that either one of the basic command data 32b and the optimization command data 33b is output by the output unit 36. For example, the switching unit 38 may perform switching such that either one of the basic processing unit 34 and the optimization processing unit 35 operates. The switching unit 38 may cause both of the basic processing unit 34 and the optimization processing unit 35 to simultaneously operate, and may control operation of the output unit 36 so as to cause the output unit 36 to output only a processing result of either one of these processing units. As described above, as one example in this example, the switching unit 38 causes the optimization processing unit 35 to operate with higher priority and, when having detected a trigger indicating a request to cause the basic processing unit 34 to operate, performs switching such that the basic processing unit 34 operates. When having detected a trigger indicating a request to cause the optimization processing unit 35 to operate while the basic processing unit 34 is operating, the switching unit 38 performs switching such that the optimization processing unit 35 operates. Herein, the triggers are set in advance as an opportunity for processing switch in the switching unit 38. Specific examples of the triggers include a processing switch request that is manually input by operator's operation and a control signal indicating an instruction to perform rollback processing which is notified from the abnormal processing detection unit 37. For example, each trigger is associated with information indicating which of the basic processing unit 34 and the optimization processing unit 35 needs to be switched to operate. In this example, by referring to this information, the switching unit 38 can perform switching such that one of the basic processing unit 34 and the optimization processing unit 35 operates.

When occurrence of abnormal processing has been detected by the abnormal processing detection unit 37, that is, when the switching unit is notified of detection information by the abnormal processing detection unit 37, the switching unit 38 detects this notification of the detection information as a trigger indicating a request to cause the basic processing unit 34 to operate, and performs switching such that the basic processing unit 34 operates. In other words, the switching unit 38 causes the optimization processing unit 35, in which occurrence of abnormal processing has been detected, to stop processing, and causes the basic processing unit 34 to start processing. As described above, when occurrence of abnormal processing has been detected in the processing performed by the optimization processing unit 35, the switching unit 38 automatically performs switching such that the basic processing unit 34 operates, whereby the abnormal processing can be prevented from being continued, and operation of each carriage 2 can be continued by using the basic command data 32b generated by the basic processing unit 34.

The switching unit 38 receives notification of completion information from the restoration unit 39 described later, thereby detecting that restoration of the process content of the optimization processing unit 35 performed by the restoration unit 39 has been completed, and then performs switching such that the optimization processing unit 35 operates. In other words, the switching unit 38 detects the notification of completion information from the restoration unit 39 as a trigger indicating a request to cause the optimization processing unit 35 to operate, and performs switching such that the optimization processing unit 35 operates. As described above, during a period from the detection of the occurrence of abnormal processing to the reception of the notification of completion information from the restoration unit 39, the switching unit 38 causes the basic processing unit 34 to operate. When having received the notification of completion information from the restoration unit 39, the switching unit performs switching such that the optimization processing unit 35 operates again. Thus, until restoration of the process content of the optimization processing unit 35 is completed by the restoration unit 39, operation of the carriage 2 can be continued by causing the basic processing unit 34 to operate. After the restoration of the process content of the optimization processing unit 35 has been completed, conveyance operation of the carriage 2 can be sophisticated (made efficient, or optimized, for example) by causing the optimization processing unit 35 to operate again.

The restoration unit 39 is means (restoration means) for restoring a process content of the optimization processing unit 35 when occurrence of the abnormal processing has been detected by the abnormal processing detection unit 37, that is, when the restoration unit has been notified of detection information by the abnormal processing detection unit 37. Specifically, in accordance with a restoration method set in advance, the restoration unit 39 restores a process content of the optimization processing unit 35 the operation of which is switched to be stopped by the switching unit 38. At this time, for example, when damaged data is stored in the optimization-processing-data storage unit 33 by data processing of the optimization processing unit 35, the restoration unit 39 performs restoration (e.g., initialization) of the data stored in the optimization-processing-data storage unit 33. If initialization or the like of the data stored in the optimization-processing-data storage unit 33 is necessary, the restoration unit 39 may save (copy) the data to be initialized in another storage area before the initialization is performed. The saved data can be used for cause analysis of abnormality occurrence, for example.

Herein, an example is assumed in which, after update processing such as adding a new function has been performed on software that specifies a process content of the optimization processing unit 35, occurrence of abnormal processing due to a defect in updated software has been detected. Hereinafter, the "software that specifies a process content of the optimization processing unit 35" is called "software of the optimization processing unit 35". In this example, the restoration unit 39 performs rollback processing for recovering the software of the optimization processing unit 35 to the software before being updated, thereby being able to restore the process content of the optimization processing unit 35. After having completed this restoration processing, the restoration unit 39 notifies the switching unit 38 of completion information indicating that the restoration has been completed.

Figure 5:
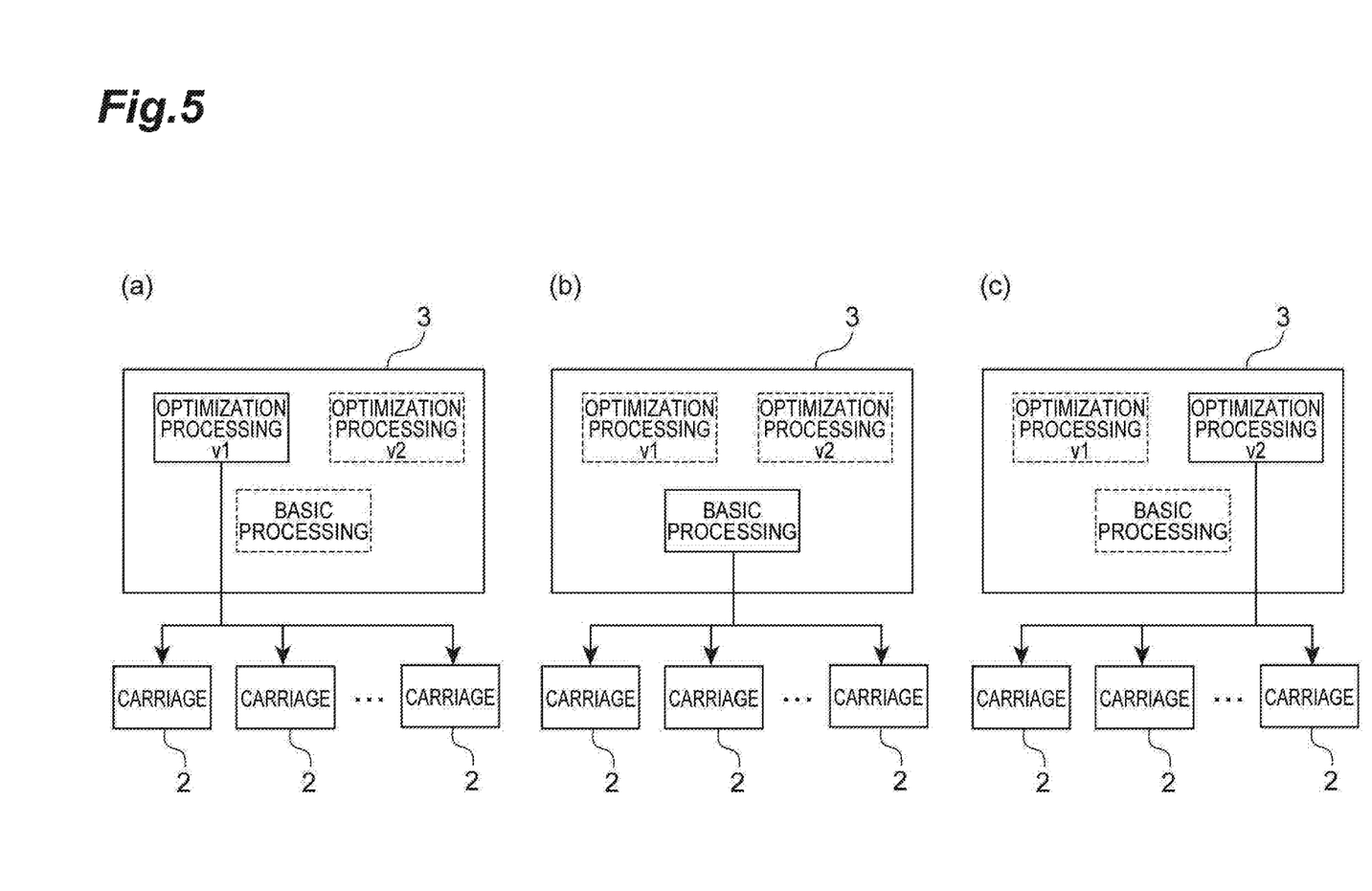
FIG. 5 (a, b and c) are schematic diagrams for explaining update processing and rollback processing.

The following describes the update processing and the rollback processing performed on the software of the optimization processing unit 35 with reference to FIGS. 5(a)-5(c). FIGS. 5(a) to 5(c) are schematic diagrams for explaining the update processing and the rollback processing. In FIGS. 5(a)-5(c), the blocks of "optimization processing v1" indicate processing of the optimization processing unit 35 before the update processing, the blocks of "optimization processing v2" indicate processing of the optimization processing unit 35 after the update processing, and the blocks of "basic processing" indicate processing of the basic processing unit 34.

FIG. 5(a) illustrates a state before the update processing. In this state, because switching has been performed by the switching unit 38 such that the optimization processing unit 35 operates with higher priority, optimization command data 33b generated by processing (optimization processing v1) of the optimization processing unit 35 is output to carriages 2.

FIG. 5(c) illustrates a state after the update processing. In this state, because switching has been performed by the switching unit 38 such that the optimization processing unit 35 operates with higher priority, optimization command data 33b generated by processing (optimization processing v2) of the optimization processing unit 35 is output to the carriages 2.

FIG. 5(b) illustrates an intermediate state during the update processing or during the rollback processing. This intermediate state indicates a state in which processing cannot be performed by the optimization processing unit 35 during the update processing or during the rollback processing. In the intermediate state, switching is performed by the switching unit 38 such that the basic processing unit 34 operates, and thus basic command data 32b generated by processing (basic processing) of the basic processing unit 34 is output to the carriages 2.

Figure 6:
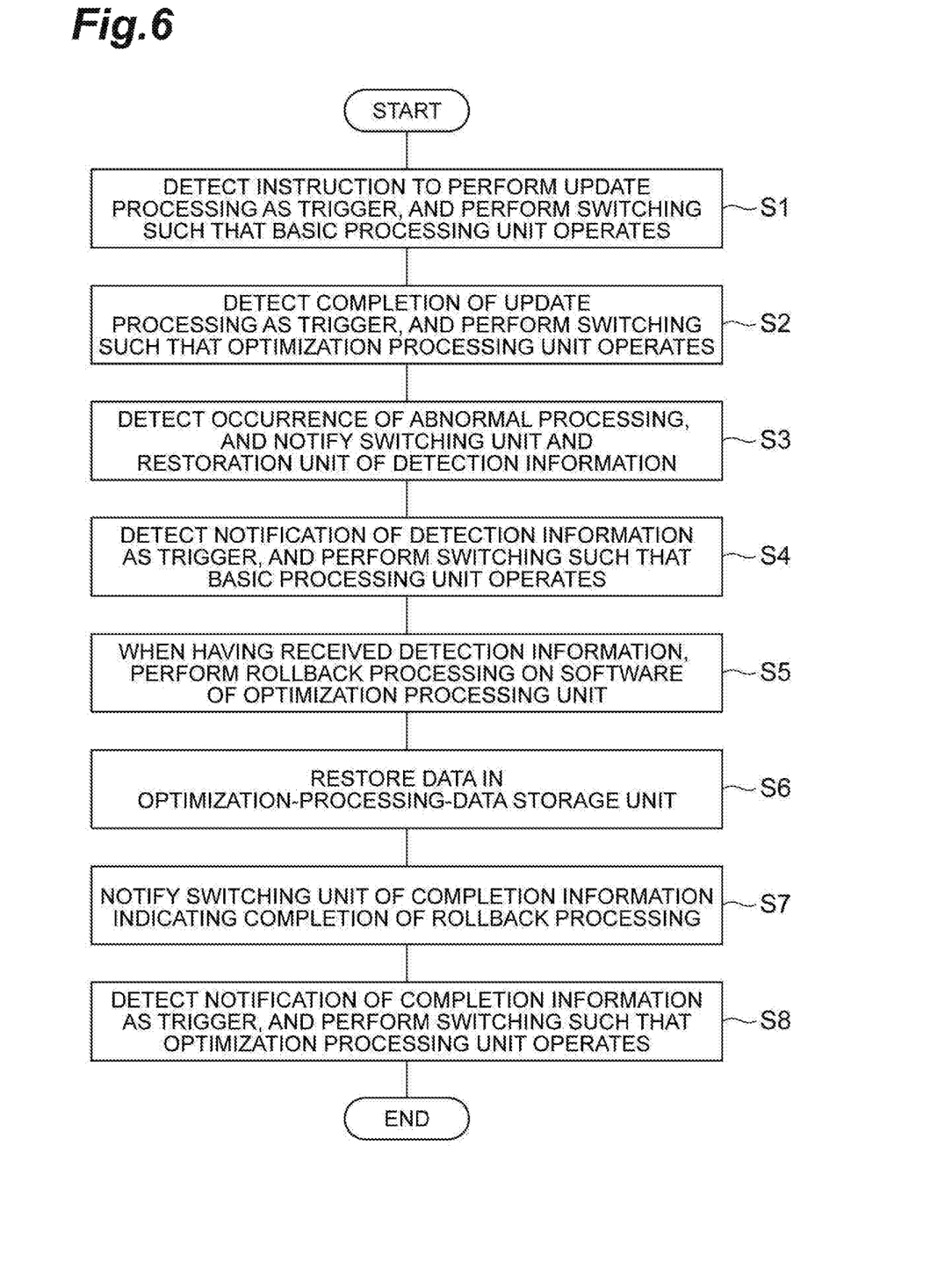
FIG. 6 is a flowchart illustrating operation of the conveyance control system.

The following describes examples of operations (steps S1 and S2) of the controller 3 before and after update processing and examples of operations (steps S3 to S8) of the controller 3 before and after rollback processing with reference to FIG. 6.

In the state before the update processing depicted in FIG. 5(a), for example, when an instruction to perform update processing on the software of the optimization processing unit 35 has been given by operation of the operator, for example, the switching unit 38 detects this instruction as a trigger for processing switch, and performs switching such that the basic processing unit 34 operates (step S1). In other words, at step S1, the switching unit 38 causes the optimization processing unit 35 to stop processing and causes the basic processing unit 34 to start processing. This causes a transition to the intermediate status depicted in FIG. 5(b). As described above, the switching unit 38 detects, as a trigger, that the update processing has been performed on the software of the optimization processing unit 35, and performs switching such that the basic processing unit 34 operates, whereby operation control of each carriage 2 can be continued based on the basic command data 32b. During this period, although high-level conveyance control for achieving total optimization cannot be performed, switching to the low-level basic processing for stable operation can prevent operation of each carriage 2 from stopping, and can cause work of conveying FOUPs to continue. Software for an update (software that specifies the optimization processing v2) is stored in advance in, for example, the auxiliary storage device 307 of the controller 3 by operation of the operator, for example, before the update processing. Software before being updated (software that specifies the optimization processing v1) is stored for the rollback processing in, for example, the auxiliary storage device 307 of the controller 3 still after the update processing.

When the update processing on the software of the optimization processing unit 35 has been completed and, for example, an instruction to cause the optimization processing unit 35 to operate again has been given by operation of the operator, for example, the switching unit 38 detects this instruction as a trigger for processing switch, and performs switching such that the optimization processing unit 35 operates (step S2). In other words, at step S2, the switching unit 38 causes the basic processing unit 34 to stop processing, and causes the optimization processing unit 35 to restart processing. This causes a transition to the state after the update processing depicted in FIG. 5(c).

In the state after the update processing depicted in FIG. 5(c), the abnormal processing detection unit 37 monitors processing of the optimization processing unit 35. When having detected occurrence of abnormal processing, the abnormal processing detection unit 37 notifies the switching unit 38 and the restoration unit 39 of detection information (step S3). When having received notification of the detection information from the abnormal processing detection unit 37, the switching unit 38 detects the notification of the detection information as a trigger, and performs switching such that the basic processing unit 34 operates (step S4). In other words, at step S4, the switching unit 38 causes the optimization processing unit 35 to stop processing, and causes the basic processing unit 34 to start processing. This causes a transition to the intermediate state depicted in FIG. 5(b). Subsequently, after having received the notification of the detection information and after the optimization processing unit 35 is caused to stop processing by the switching unit 38, the restoration unit 39 performs rollback processing for recovering the software of the optimization processing unit 35 from the updated software (software that specifies the optimization processing v2) to the software before being updated (software that specifies the optimization processing v1) (step S5). When data stored in the optimization-processing-data storage unit 33 by data processing of the optimization processing unit 35 has been damaged, the restoration unit 39 performs restoration (e.g., initialization) of the data stored in the optimization-processing-data storage unit 33 (step S6). Herein, if initialization or the like of the data stored in the optimization-processing-data storage unit 33 is necessary, the restoration unit 39 may save (copy) the data to be initialized in another storage area before the initialization is performed. The saved data can be used for cause analysis of abnormality occurrence, for example. The order in which step S5 and step S6 are performed is not limited to that illustrated in FIG. 6. For example, step S5 and step S6 may be performed in parallel, or step S5 may be performed after step S6 is performed.

When the processes at step S5 and step S6 have been completed, the restoration unit 39 notifies the switching unit 38 of completion information indicating completion of the rollback processing (step S7). When having received notification of the completion information from the restoration unit 39, the switching unit 38 detects this notification of the completion information as a trigger, and performs switching such that the optimization processing unit 35 operates (step S8). In other words, at step S8, the switching unit 38 causes the basic processing unit 34 to stop processing, and causes the optimization processing unit 35 to restart processing. This causes a transition to the state before the update processing depicted in FIG. 5(a).

As described above, in the controller 3 according to this example, pieces of command data to be output to the carriages 2 can be generated by the basic processing unit 34 and the optimization processing unit 35. Whether the command data generated by the basic processing unit 34 or the command data generated by the optimization processing unit 35 is to be output can be switched by the switching unit 38. Thus, with the controller 3, even if abnormal processing has occurred in one of the basic processing unit 34 and the optimization processing unit 35 (in the optimization processing unit 35 as one example in the present embodiment) due to a software bug, for example, switching can be performed such that command data generated by the other of the basic processing unit 34 and the optimization processing unit 35 is output. This enables the output unit 36 to continue outputting command data to each carriage 2. This consequently enables each carriage 2 to continue to perform operation based on command data, and thus operations of the carriages 2 can be prevented from stopping.

In the controller 3, the optimization processing unit 35 configured to generate the optimization command data 33b containing information items more than those of the basic command data 32b on the basis of the optimization input data 33a containing information items more than those of the basic input data 32a is caused to operate with higher priority. As a result, under normal conditions, the optimization command data 33b that is more detailed than the basic command data 32b can be output to each carriage 2, and thus conveyance operation of the carriage 2 can be sophisticated (made efficient, or optimized, for example). When having detected a trigger indicating a request to cause the basic processing unit 34 to operate, the switching unit 38 performs switching such that basic processing unit 34 operates. Thus, for example, when processing by the optimization processing unit 35 cannot be performed because, for example, a process content of the optimization processing unit 35 needs to be changed by update processing, rollback processing, and the like to be performed on software, operation of each carriage 2 can be continued by outputting the basic command data 32b generated by the basic processing unit 34 to the carriage 2.

In the conveyance control system 1 according to this example, in the controller 3, pieces of command data to be output to the carriages 2 can be generated by the basic processing unit 34 and the optimization processing unit 35. Each carriage 2 includes operation control units (the basic operation control unit 23 and the optimization operation control unit 24) that respectively correspond to the basic command data 32b and the optimization command data 33b that the carriage can receive. In other words, the controller 3 and each carriage 2 include a basic control line (a pair of the basic processing unit 34 and the basic operation control unit 23) configured to perform operation control of the carriage 2 based on the basic command data 32b and an optimized control line (a pair of the optimization processing unit 35 and the optimization operation control unit 24) configured to perform operation control of the carriage 2 based on the optimization command data 33b. Thus, with the conveyance control system 1, even if abnormal processing has occurred in processing in one line (the optimized control line as one example in this example), operation control of each carriage 2 can be continued when switching is performed by the switching unit 38 such that the other line operates. This can prevent operations of the carriages 2 from stopping.

In the foregoing, systems have been described in detail based on an example thereof. However, this disclosure is not limited to the above-described example. Various modifications can be made within the scope not departing from the gist thereof.

As one example of conveyance control performed by the conveyance control system 1, the assignment control of assigning conveyance requests to the respective carriages 2 has been described. However, control performed by the conveyance control system 1 may be control other than the assignment control (e.g., controlling the order in which carriages 2 approach a merging section 9, or controlling the inter-carriage distance between carriages 2). Contents of the optimization processing and the basic processing are not limited to particular process contents, and may be contents depending on contents of control performed by the conveyance control system 1.

The conveyance machines to be controlled by the controller 3 are not limited to the carriages described in the example above, and may be conveyance machines such as stacker cranes other than carriages. In the example above, a configuration has been described in which the controller 3 is provided as a device separate from the conveyance machines (carriages 2) to be controlled. However, for example, if the number of conveyance machines to be controlled is only one, the controller 3 may be incorporated into the conveyance machine.

The example above has been described in which the abnormal processing detection unit 37 notifies the switching unit 38 and the restoration unit 39 of a control signal indicating an instruction to perform rollback processing when having detected occurrence of abnormal processing. However, the instruction to perform the rollback processing may be manually given to the switching unit 38 and the restoration unit 39 by operator's operation.

The invention claimed is:

1. A method of controlling operation of one or more conveyance machines each configured to convey an article, the method comprises the steps of:
   generating at least one of first command data and second command data indicating operation that each of the one or more conveyance machines is commanded to perform, wherein the first command data is generated based on first input data containing a request to convey the article and the second command data is generated based on second input data containing a request to convey the article;
   a step of monitoring the generating step to detect occurrence of abnormal processing in the generating of the second command data, wherein
   the trigger comprises the occurrence of abnormal processing detected;
   outputting the first command data or the second command data to each of the one or more conveyance machines; and
   controlling at least one of the generating step and the outputting step to selectively output the first command data or the second command data at the outputting step,
   wherein the second input data contains a basic item contained in the first input data and an additional item that is not contained in the first input data,
   the second command data contains a basic item contained in the first command data and an additional item that is not contained in the first command data, and
   the controlling step comprises controlling the generating step to generate the second command data with higher priority than generating the first command data and to switch from generating the second command data to generating the first command data when a trigger indicating a request to generate the first command data is detected.

2. The method according to claim 1 further comprising a step of restoring the generating of the second command data when the occurrence of abnormal processing has been detected at the monitoring step, wherein
   the controlling step comprises detecting that the restoring at the restoring step has been completed, and controlling the generating step to switch from generating the first command data to generating the second command data.

3. The method according to claim 1 further comprising a step of controlling each of the one or more conveyance machines to operate based on the first command data or the second command data having been selectively output.

4. A conveyance control device configured to control operation of one or more conveyance machines each configured to convey an article, the conveyance control device comprising:
   first processing means for generating first command data indicating operation that each of the one or more conveyance machines is commanded to perform, based on first input data containing a request to convey the article;
   second processing means for generating second command data indicating operation that each of the one or more conveyance machines is commanded to perform, based on second input data containing the request to convey the article;
   output means for outputting the first command data generated by the first processing means or the second command data generated by the second processing means to each of the one or more conveyance machines;
   switching means for controlling operation of at least one of the first processing means, the second processing means, and the output means such that either one of the first command data and the second command data is output by the output means,
   wherein the second input data contains a basic item contained in the first input data and an additional item that is not contained in the first input data, the second command data contains a basic item contained in the first command data and an additional item that is not contained in the first command data, and the switching means causes the second processing means to operate with higher priority than the first processing means, and performs switching such that the first processing means operates when having detected a trigger indicating a request to cause the first processing means to operate; and
   an abnormal processing detection means for monitoring processing performed by the second processing means to detect occurrence of abnormal processing, wherein
   the switching means detects as the trigger the occurrence of abnormal processing detected by the abnormal processing detection means and performs switching such that the first processing means operates.

5. The conveyance control device according to claim 4 further comprising restoration means for restoring a process content of the second processing means when the abnormal processing detection means has detected the occurrence of abnormal processing, wherein
   the switching means detects that the restoring by the restoration means has been completed, and performs switching such that the second processing means operates.

6. A conveyance control system comprising:
   one or more conveyance machines each configured to convey an article and
   a conveyance control device configured to control operation of each of the one or more conveyance machines, wherein the conveyance control device includes:
  first processing means for generating first command data indicating operation that each of the one or more conveyance machines is commanded to perform, based on first input data containing a request to convey the article;
  second processing means for generating second command data indicating operation that each of the one or more conveyance machines is commanded to perform, based on second input data containing the request to convey the article;
  output means for outputting the first command data generated by the first processing means or the second command data generated by the second processing means to each of the one or more conveyance machines;
  switching means for controlling operation of at least one of the first processing means, the second processing means, and the output means such that either one of the first command data and the second command data is output by the output means;
  wherein the second input data contains a basic item contained in the first input data and an additional item that is not contained in the first input data, the second command data contains a basic item contained in the first command data and an additional item that is not contained in the first command data, and the switching means causes the second processing means to operate with higher priority than the first processing means, and performs switching such that the first processing means operates when having detected a trigger indicating a request to cause the first processing means to operate; and
  an abnormal processing detection means for monitoring processing performed by the second processing means to detect occurrence of abnormal processing, wherein
  the switching means detects as the trigger the occurrence of abnormal processing detected by the abnormal processing detection means and performs switching such that the first processing means operates; and
each of the one or more conveyance machines includes:
  first operation control means for receiving the first command data and controlling operation of the machine based on the first command data; and
  second operation control means for receiving the second command data and controlling the machine based on the second command data.

* * * * *